United States Patent [19]

Yamauchi

[11] Patent Number: 5,010,523

[45] Date of Patent: Apr. 23, 1991

[54] SENSING CIRCUIT FOR A DYNAMIC RANDOM ACCESS MEMORY

[75] Inventor: Hiroyuki Yamauchi, Osaka, Japan

[73] Assignee: Matsushita Electric Industrial Co., Ltd., Japan

[21] Appl. No.: 488,927

[22] Filed: Mar. 6, 1990

[30] Foreign Application Priority Data

Mar. 6, 1989 [JP] Japan .................................. 1-53099

[51] Int. Cl.$^5$ .............................................. G11C 13/00
[52] U.S. Cl. .................................... 365/205; 365/203; 365/189.01
[58] Field of Search ................... 365/203, 205, 189.01, 365/230.06

[56] References Cited

U.S. PATENT DOCUMENTS 4,932,002 6/1990 Houston .............................. 365/205

Primary Examiner—Terrell W. Fears
Attorney, Agent, or Firm—Lowe, Price, LeBlanc, Becker & Shur

[57] ABSTRACT

A sensing circuit for a dynamic random access memory of which bit lines at reference side are temporarily connected to a large load capacitance or to a precharge power source when a read operation is performed. Thereby, change in electric potential of the bit lines at the reference side occurring due to interference noises between the bit lines at the time of effecting a read operation of reading the contents of a memory cell, as well as, deterioration of a signal-to-noise ratio due to the change in electric potential of the bit lines can be effectively suppressed.

10 Claims, 10 Drawing Sheets

SENSING CIRCUIT FOR A DYNAMIC RANDOM ACCESS MEMORY

BACKGROUND OF THE INVENTION

1. Field of the Invention

This invention relates to a sensing circuit for a dynamic random access memory (DRAM).

2. Description of The Related Art

By referring to FIGS. 1a and 1b a conventional sensing circuit for a DRAM will be described hereinbelow. In these figures, reference numerals 1 and 2 respectively denote a first and second bit lines connected to a memory cell 3; 4 a sense amplifying circuit; 5 a precharge power source; 6 a precharge switch; 7 an equalizing switch; 8 a column decode switch; 9 a pair of input/output data lines (hereunder sometimes referred to simply as I/O lines); and 10 a word line. A reading operation of the conventional circuit constructed as above described is effected by performing the following steps:

(1) First, the precharge switch 6 and the equalizing switch 7 are turned on, and then each of the bit lines 1 and 2 is connected to the precharge power source 5.

(2) Then, the precharge switch 6 and the equalizing switch 7 are turned off and thus each of the bit lines 1 and 2 is separated from the precharge power source 5.

(3) Subsequently, one of the word lines 10 is selected and thus the memory 3 is electrically connected to each of the bit lines 1 and 2.

(4) Thereafter, the sense amplifier 4 is activated and thereby each signal on the bit lines 1 and 2 is amplified.

(6) Then, the column decode switch 8 is selected and further data are outputted to the pair of I/O lines 9.

However, recent rapid increase in memory density of a DRAM has been attended with radical decrease in spacing between bit lines. Thus, coupling capacitance between contiguous bit lines tends to increase. Further, it is said that, in case of a 16M-bit DRAM and a 64M-bit DRAM which are most highly integrated DRAMs having highest memory densities obtainable now, the ratio of noises received from a contiguous bit line to all read signals from a memory cell reaches 40% or so due to the coupling capacitance thereof. Practically, as shown in FIG. 2, when the level in voltage of a read signal $\Delta V_S$ from the memory cell 3 to the bit lines 1, 1' or 1'' is 100 milli-volt (mV), that in voltage of a noise $\Delta V_N$ received by the contiguous bit line 2, 2' or 2'' having a reference electric potential is 40 mV or so. Thus, the level of the read signal $\Delta V_S$ is lowered by that of the noise $\Delta V_N$ to a level of an effective read signal $\Delta V$. For example, in case of a pair (1) of the bit lines 1 and 2, the level of the effective read signal $\Delta V_1$ is obtained from the levels of the read signal $\Delta V_{S1}$ and the noise $\Delta V_{N1}$ as follows:

$$\Delta V_1 = \Delta V_{S1} - \Delta V_{N1} = 100 - 40(mV) = 60(mV).$$

Further, in case of a pair (2) of the bit lines 1' and 2', the level of the effective read signal $\Delta V_2$ is obtained from the levels of the read signal $\Delta V_{S2}$ and the noise $\Delta V_{N2}$ as follows:

$$\Delta V_2 = \Delta V_{S2} - \Delta V_{N2} = 100 + 40(mV) = 140(mV).$$

Moreover, in case of a pair (3) of the bit lines 1'' and 2'', the level of the effective read signal $\Delta V_3$ is obtained from the levels of the read signal $\Delta V_{S3}$ and the noise $\Delta V_{N3}$ as follows:

$$\Delta V_3 = -(\Delta V_{S3} - \Delta V_{N3}) = -(100 - 40)(mV) = -60(mV).$$

Thus, the conventional sensing circuit has a drawback that an operating margin of the sense amplifier 4 connected to the pair of the bit lines 1 and 2 and to that of the bit lines 1'' and 2'' decreases.

In addition, as shown in FIG. 3, when the sense amplifier 4 is activated, the value of the difference $\Delta V$ in electrical potential between the bit lines of a pair rather differs from pair to pair owing to the interference noises previously described. Thus, the signals on the bit lines 1' and 2' of the pair (2) having an originally large difference $\Delta V$ in electric potential as above described are amplified faster than in cases of the other pairs (1) and (3). In contrast, the signals on the bit lines 1-2 of 1''-2'' of the pair (1) or (3) having an originally small difference $\Delta V$ in electric potential as above described are amplified slower than in case of the pair (2). Moreover, the amplification of the signal on the bit lines 1-2 or 1''-2'' of the pair (1) or (3) having an originally small diference $\Delta V$ becomes further delayed under the influence of the interference noises from the bit lines 1' and 2' of the pair (2). Thus, the conventional sensing circuit has drawbacks that access time becomes considerably large and a malfunction is liable to occur.

Further, the foregoing drawbacks of the conventional sensing circuit for a DRAM will become more serious in view of further rapid increase in memory density and in the degree of integration thereof in the future.

SUMMARY OF THE INVENTION

The present invention is accomplished to eliminate the above described drawbacks of the conventional sensing circuit.

It is accordingly an object of the present invention to provide a sensing circuit for a DRAM which can suppress the influence of the interference noise on the levels of signals flowing through the contiguous bit lines and can prevent occurrence of a malfunction.

To achieve the foregoing object and in accordance with the present invention, there is provided a sensing circuit for a dynamic random access memory, of which bit lines at reference side are temporarily connected to a large load capacitance or to a precharge power source when a read operation is performed, thereby suppressing change in electric potential of the bit lines at the reference side occurring due to interference noises between the bit lines at the time of effecting a read operation of reading the contents of a memory cell. Further, in accordance with the preferred embodiment, there is provided a sensing circuit for a dynamic random access memory which comprises a plurality of pair of a first bit line connected to a memory cell and a second bit line having the complementary relation to the first bit line, a first semiconductor switch controlled by a signal on a first signal conductor and connected to between the first bit lines of the pairs of the bit lines and a second semiconductor switch controlled by a signal on a second signal conductor and connected to between the second bit lines of the pairs of the bit lines.

Thus, when a read signal $\Delta V$ is outputted to the first bit line, all of the second lines, which are references for the first bit lines, can be connected to the large load capacitance or the power source by turning the second semiconductor switch, which is controlled in accordance with the signal on the second signal line, on. Thereby, the influence of the noise from the corresponding contiguous bit line (that is, the first bit line) on each of the second bit lines can be suppressed. Further, the present invention can substantially decrease the number of the pair of the bit lines, on which the amplification of the signal is badly delayed when a sense amplifier is activated. Moreover, the occurrence of a malfunction can be effectively prevented. Hence, can be also suppressed the influence of the noise from the corresponding contiguous bit lines on each bit line even when the sense amplifier is activated.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 1a shows a sense amplifier used in the circuit of FIG. 1;

DETAILED DESCRIPTION OF PREFERRED EMBODIMENTS

Hereinafter, preferred embodiments of the present invention will be described in detail by referring to the accompanying drawings.

Figure 1:
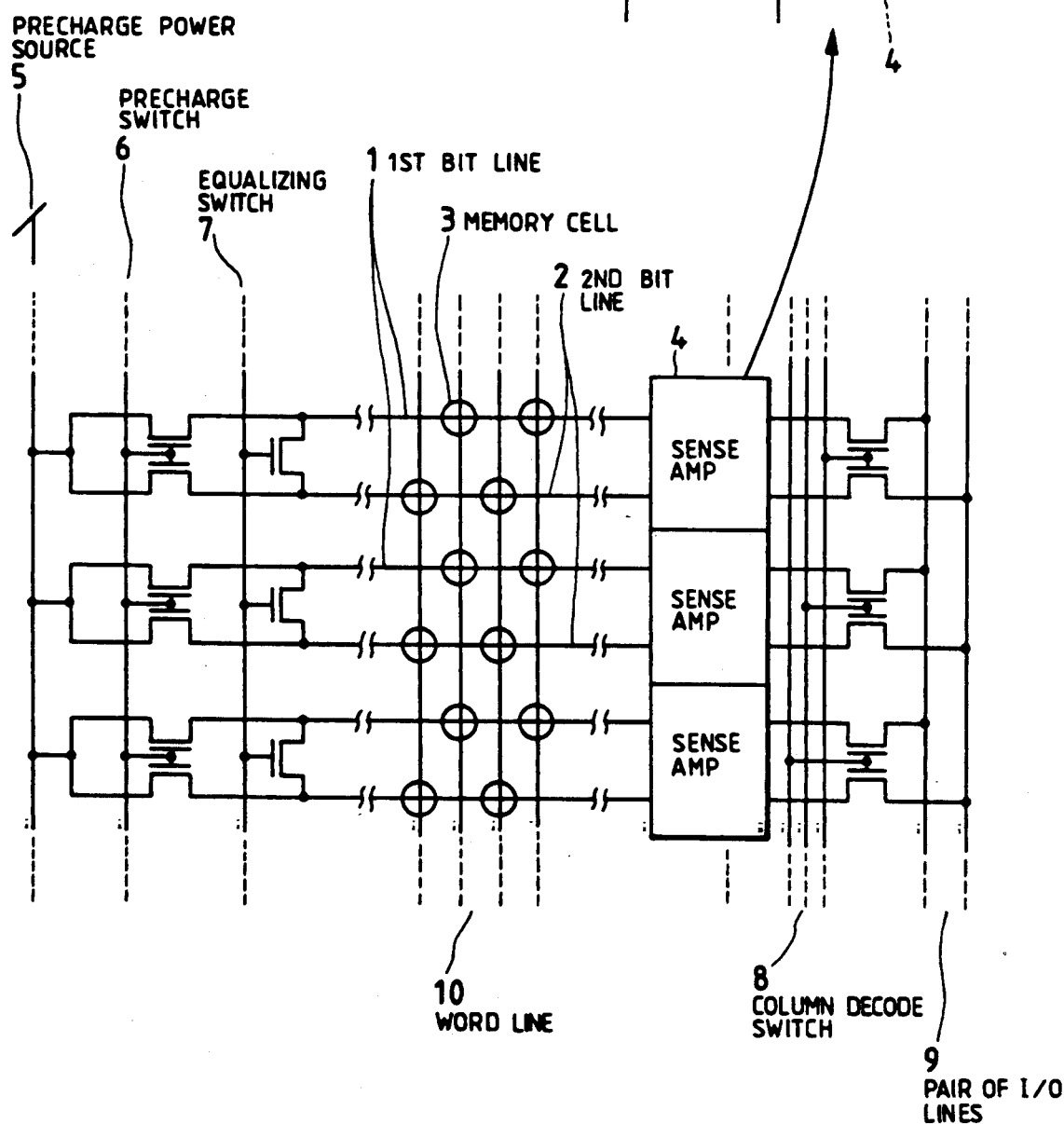
FIG. 1 is a circuit diagram of a conventional sensing circuit for a DRAM.
Figure 2:
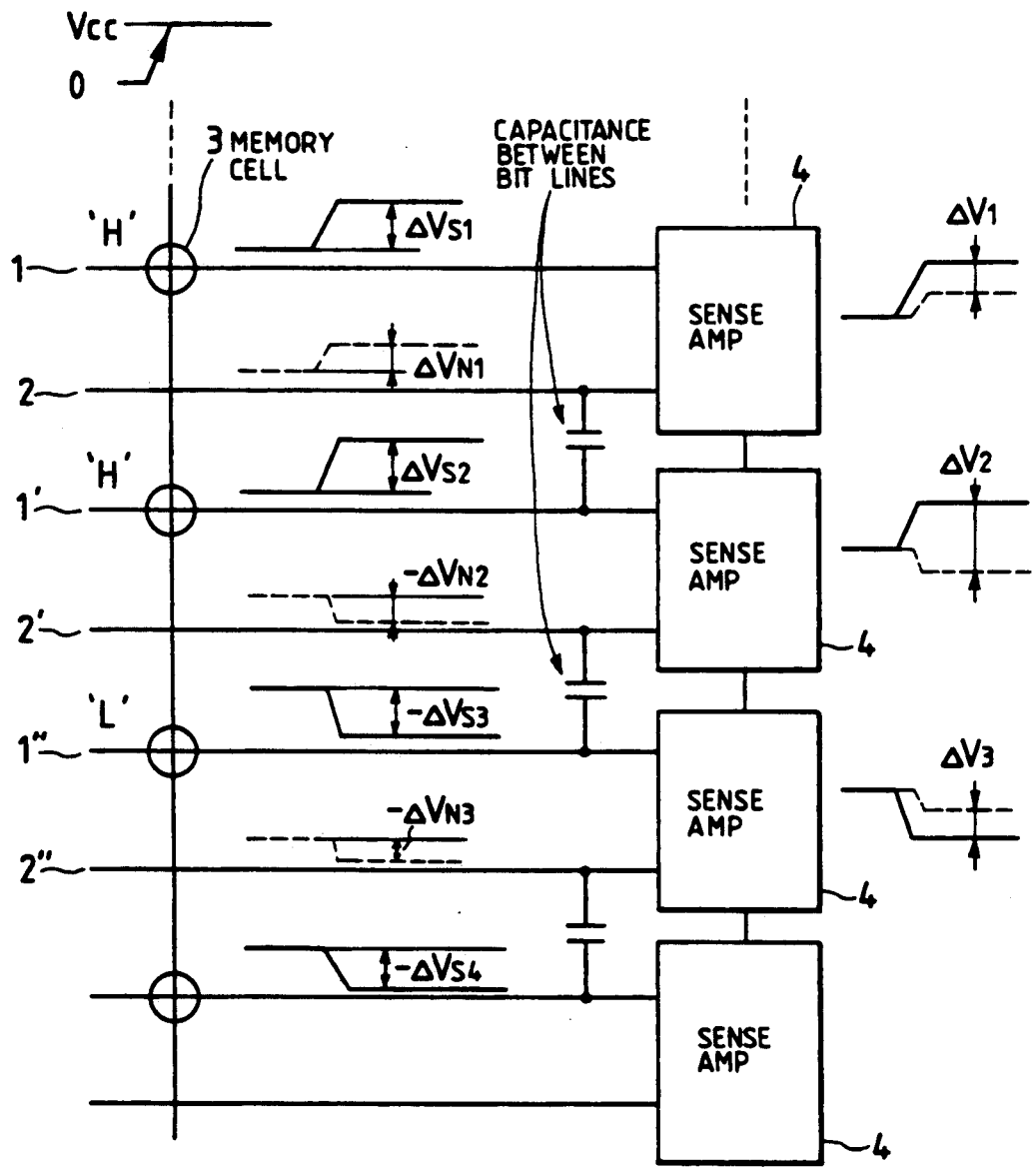
FIGS. 2 and 3 are diagrams for illustrating an operation of the conventional sensing circuit of FIG. 1.
Figure 3:
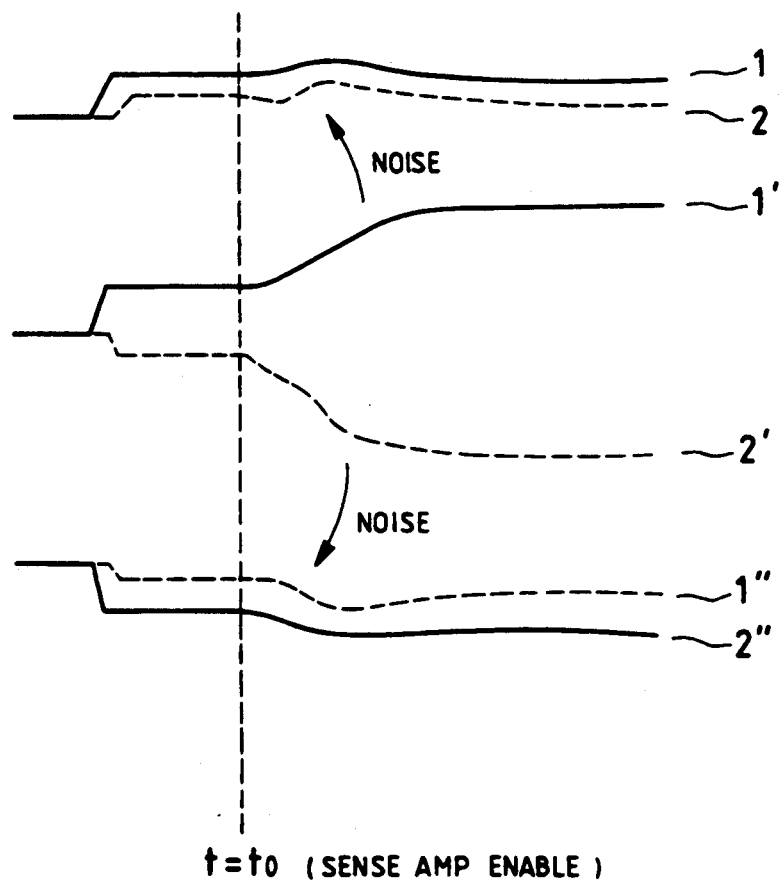

FIGS. 4, 5, 7, 9 and 10 are circuit diagrams of sensing circuits for a DRAM embodying the present invention. Incidentally, the basic portions of each of the sensing circuits of FIGS. 4, 5, 7 and 9 have the same construction of that of the conventional sensing circuit of FIG. 1. Therefore, like reference numerals designate like or corresponding composing portions of the conventional sensing circuit of FIG. 1 throughout FIGS. 4, 5, 7 and 9. Further, the repetition of the descriptions of such composing portions will be avoided.

Figure 4:
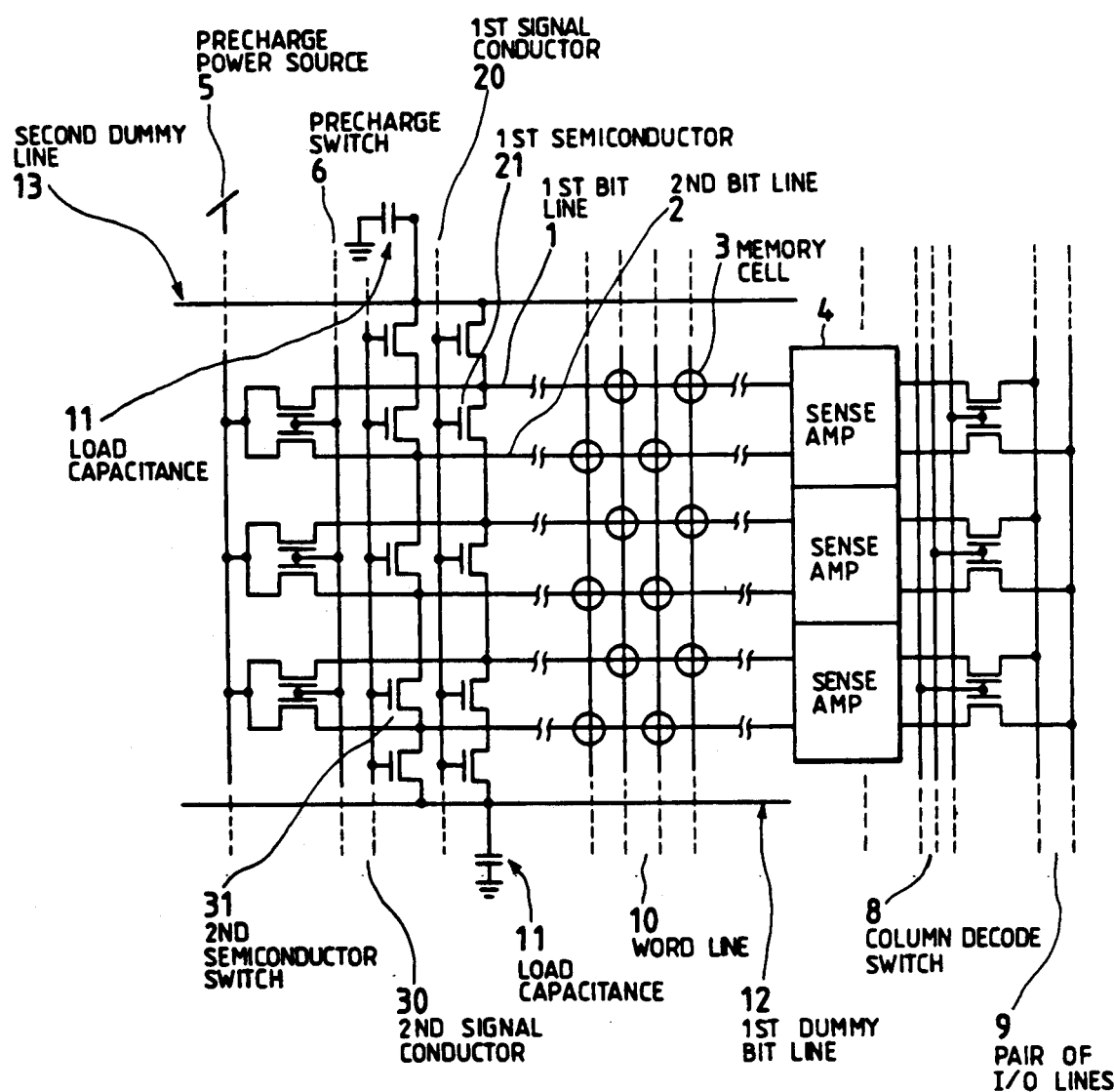
FIGS. 4 and 5 are circuit diagrams each for partly showing the construction of a first embodiment of the present invention.
Figure 5:
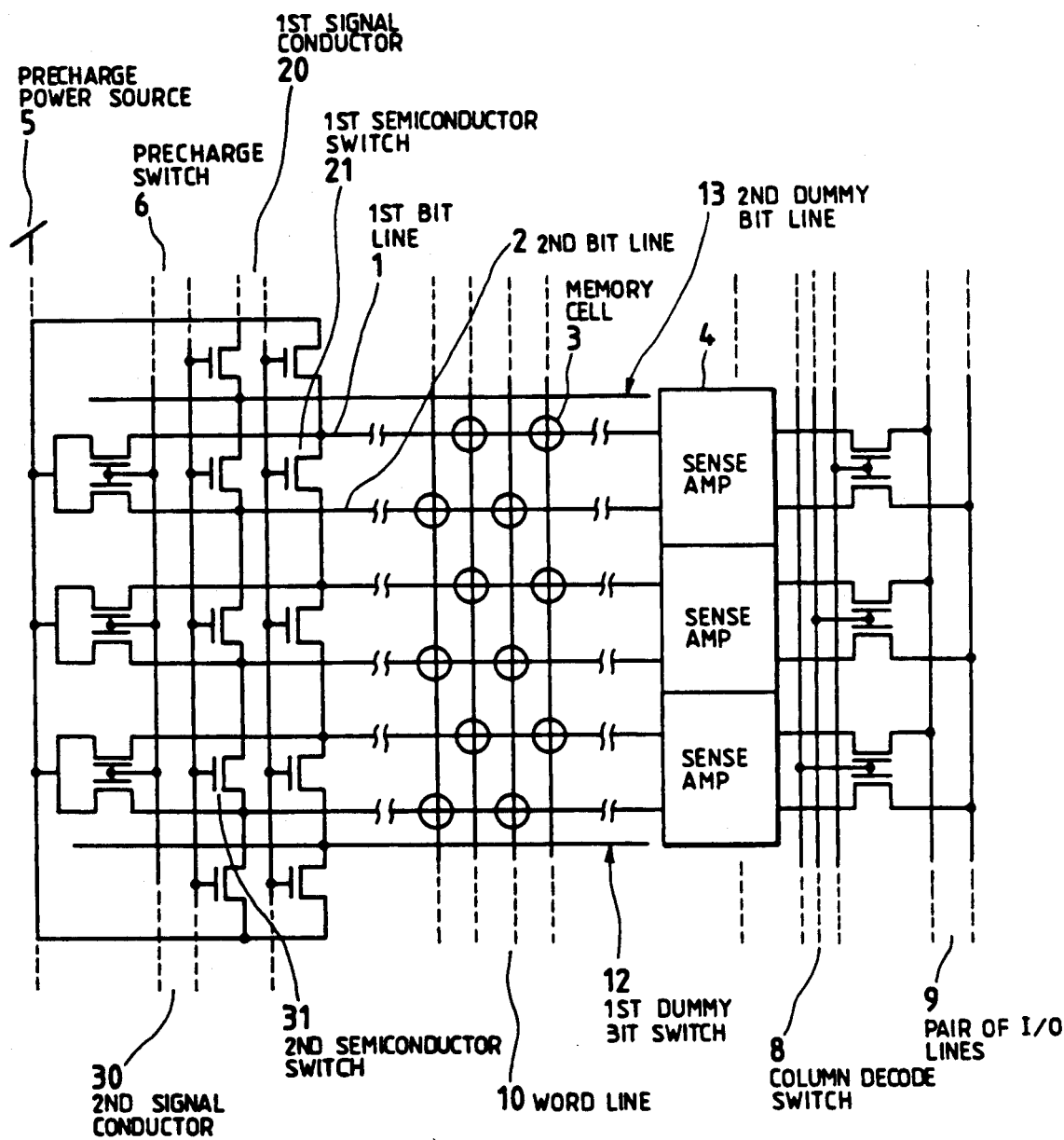

Referring first to FIGS. 4 and 5, there is shown a first embodiment of the present invention. The construction and operation of this sensing circuit for a DRAM will be described hereinbelow.

In these figures, reference numeral 11 denotes a load capacitance. Further, reference numerals 12 and 13 denotes first and second dummy bit lines which are provided in order to equalize coupling capacitance between every pair of contiguous first and second bit lines 1 and 2, that is, in order to prevent the occurrence of a phenomenon that only the outermost bit lines have coupling capacitance smaller than the coupling capacitance of the other bit lines.

In this embodiment, these first and second dummy bit lines are provided therein correspondingly to every power source 5 or to every load capacitance 11. Incidentally, only a part of such configuration is schematically shown in FIGS. 4 and 5. Further, as shown in these figures, the construction of this sensing circuit is the same as that of the conventional sensing circuit except that signals sent through a first signal conductor 20 and a second signal conductor 30 respectively control a first semiconductor switch 21 and a second semiconductor switch 31, which are used to equalize the electric potentials of pairs of bit lines.

Figure 6:
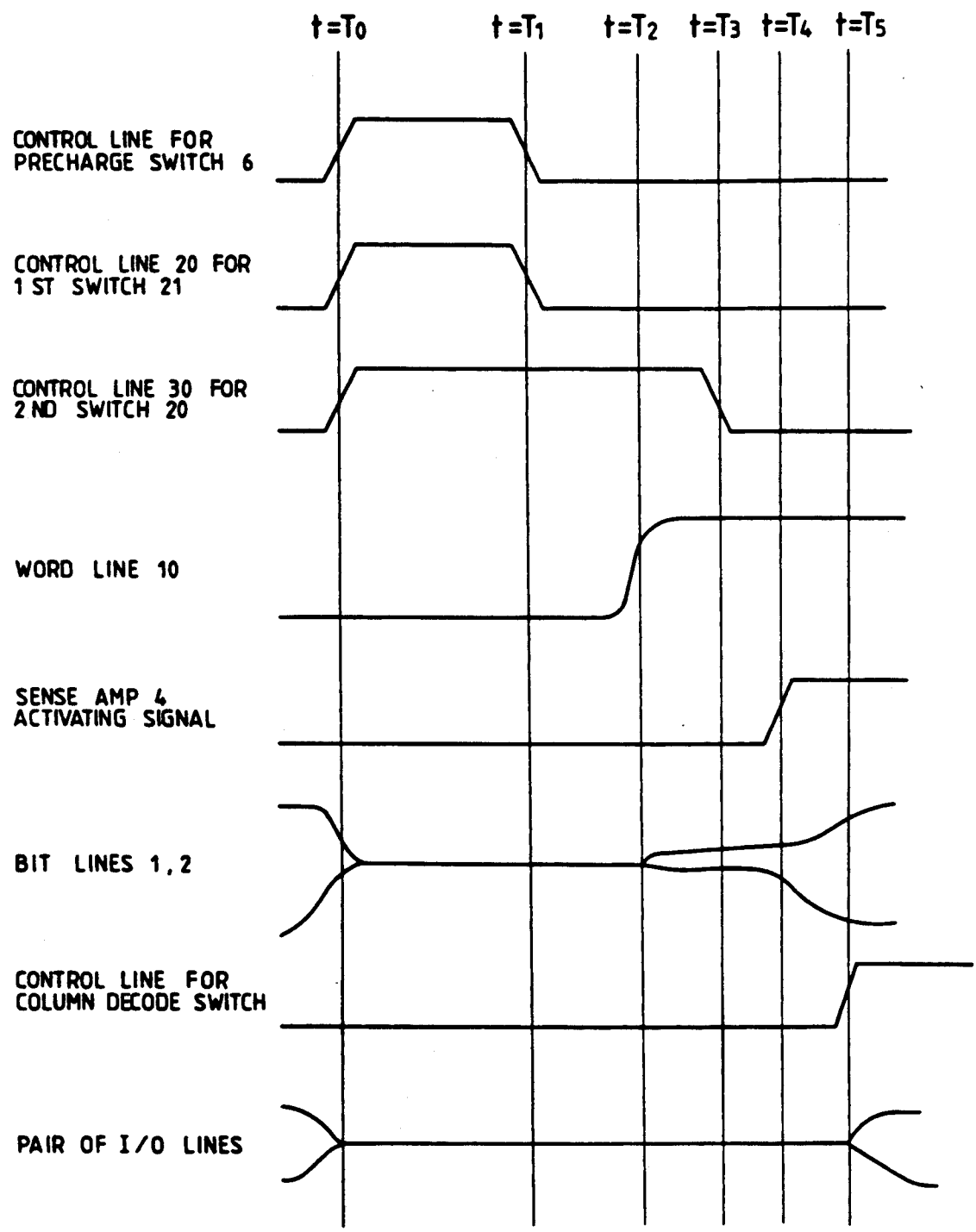
FIG. 6 is a timing chart for illustrating an operation of the first embodiment of the present invention.

Next, a reading process in case of this embodiment will be explained hereinbelow by referring to a timing chart of FIG. 6. Namely, the reading process comprises the following steps:

(1) First, at a time $T_0$, a precharge switch 6 and the first and second semiconductor switches 21 and 31 are turned on, and then each of the bit lines 1 and 2 is connected to the precharge power source 5.

(2) Further, at a time $T_1$, are turned off only the precharge switch 6 and the semiconductor switch 21 connected to the bit line 1 which is connected to a memory cell 3 selected by a signal sent through a word line 10. Then, the bit line 1 is separated from the precharge power source 5.

(3) Subsequently, at a time $T_2$, one of the word lines 10 is selected and thus the memory 3 and the bit line 1 are electrically connected to each other.

(4) Thereafter, at a time $T_3$, the semiconductor switch 31, which is turned on in the step (2) and is being on, is also turned off and thus the bit line 2 is separated from the large load capacitance 11 or the precharge power source 5.

(5) Furthermore, at a time $T_4$, a sense amplifier 4 is activated and thereby the signal on the bit line 1 or 2 is amplified.

(6) Then, at a time $T_5$, a column decode switch 8 is selected and further data are outputted to a pair of I/O lines 9.

Further, all of the bit lines 1 or 2 on the reference side are connected to each other, and "0" is read from some of a plurality of memory cells 3 selected and on the other hand "1" is read from others thereof. Therefore, it may well be that the influence of the noise from the contiguous bit lines on each of the bit lines on the reference side is partly cancelled. Moreover, even if the cancelled part of the influence of the noise is small, the electric potentials of the bit lines on the reference side are common and equal to each other and thus the quantity of noises received by each pair of the bit lines is considered to be equal to each other. More than anything else, large load capacitance 11 or the precharge power source 5 is connected to each pair of the bit lines, so that the quantity of change in electric potential of each bit line is considered to be extremely small. Thus, when the sense amplifier 4 is activated, there disappears pairs of the bit lines 1 and 2, on which the amplification of a signal is delayed. Therefore, the signal on the bit lines on the reference side becomes hard to be affected by the noises from the contiguous bit lines.

Incidentally, let $R_{ON}$ (ohm ($\Omega$)) denotes a total ON-state series resistance of the first semiconductor switches or the second semiconductor switches which are connected in series from the power source 5 or the load capacitance 11 to the outermost bit line; C (farads(F)) the capacity of the power source 5 or the capacitance 11; and T a time necessary for absorption of the noise by the power source 5 or the capacitance 11. The total ON-state series resistance $R_{ON}$ necessary for the absorption of the noise by the power source 5 or the capacitance 11 within a time T is given by the following equation:

$$R_{ON}=T/C$$

In this embodiment, when the magnitude of the noise corresponds to a fourth (i.e. 25%) of charges on the bit lines, the capacity C is 50 femto-farads (fF). Further, the time T is assumed to be 5 nano-seconds (nsec). In this case, the necessary resistance $R_{ON}$ obtained by substituting these values of the capacity C and the time T in the equation above is $10^5$ ($\Omega$). This is practically realizable in this embodiment.

By employing thus constructed sensing circuit for a DRAM embodying the present invention, can be prevented the occurrence of the phenomenon, which is the problem of the conventional sensing circuit as described above, that the electric potential of each bit line on the reference side varies with the voltage detected by the corresponding continuous bit line, and the difference in electric potential between each pair of the bit lines becomes small.

Figure 7:
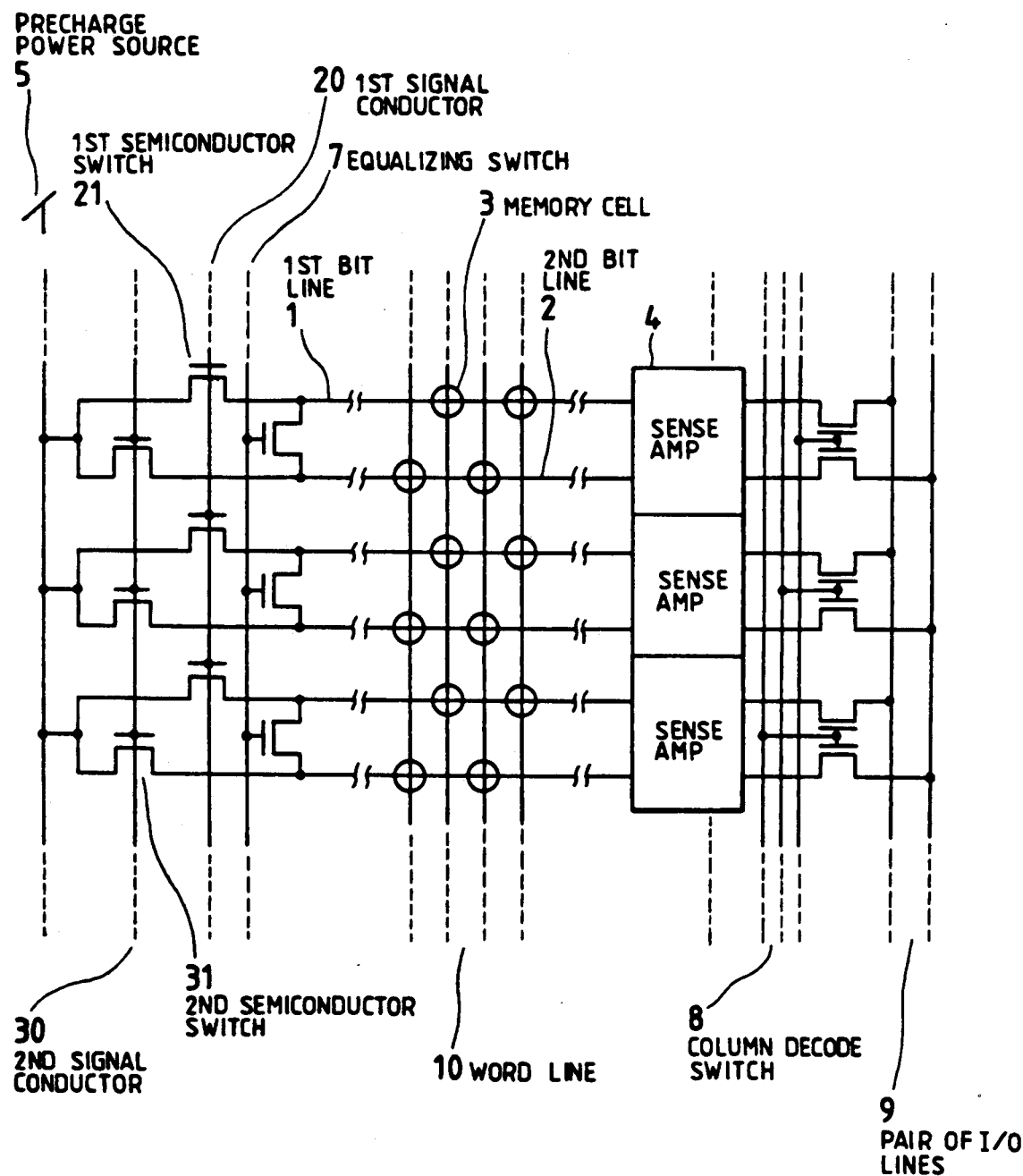
FIG. 7 is a circuit diagram for partly showing the construction of a second embodiment of the present invention.

Referring now to FIG. 7, there is shown a second embodiment of the present invention. The construction and operation of this sensing circuit for a DRAM will be described hereinbelow.

First, as shown in this figure, the construction of this sensing circuit is the same as that of the conventional sensing circuit except that signals sent through a first signal conductor 20 and a second signal conductor 30 respectively control a first semiconductor switch 21 and a second semiconductor switch 31, which are used to equalize the electric potentials of pairs of bit lines.

Further, a reading process in case of this embodiment will be explained hereinbelow by referring to a timing chart of FIG. 8. Namely, the reading process of this sensing circuit comprises the following steps:

(1) First, at a time $T_0$, an equalizing switch 7 and the first and second semiconductor switches 21 and 31 are turned on, and then each of the bit lines 1 and 2 is connected to the precharge power source 5.

(2) Subsequently, at a time $T_1$, are turned off the equalizing switch 7 and the semiconductor switch 21 connected to the bit line 1 which is connected to a memory cell 3 selected by a signal sent through a word line 10. Then, the bit line 1 is separated from the precharge power source 5.

(3) Further, at a time $T_2$, one of the word lines 10 is selected and thus the memory 3 and the bit line 1 are electrically connected to each other.

(4) Then, at a time $T_3$, the semiconductor switch 31, which is turned on in the step (2) and is being on, is also turned off and thus the bit line 2 is separated from the precharge power source 5.

(5) Thereafter, at a time $T_4$, a sense amplifier 4 is activated and thereby the signal on the bit line 1 or 2 is amplified.

(6) Furthermore, at a time $T_5$, a column decode switch 8 is selected and further data are outputted to a pair of I/O lines 9.

Further, all of the bit lines on the reference side are still connected to the precharge power source 5. Therefore, when the sense amplifier 4 is activated, there disappear pairs of the bit lines 1 and 2, on which the amplification of a signal is delayed. Thus, the signal on the bit lines on the reference side becomes hard to be affected by the noises from the contiguous bit lines.

Thus, can be prevented the occurrence of the phenomenon, which is the problem of the conventional sensing circuit as described above, that the electric potential of each bit line on the reference side varies with the voltage sensed by the corresponding contiguous bit line.

Figure 9:
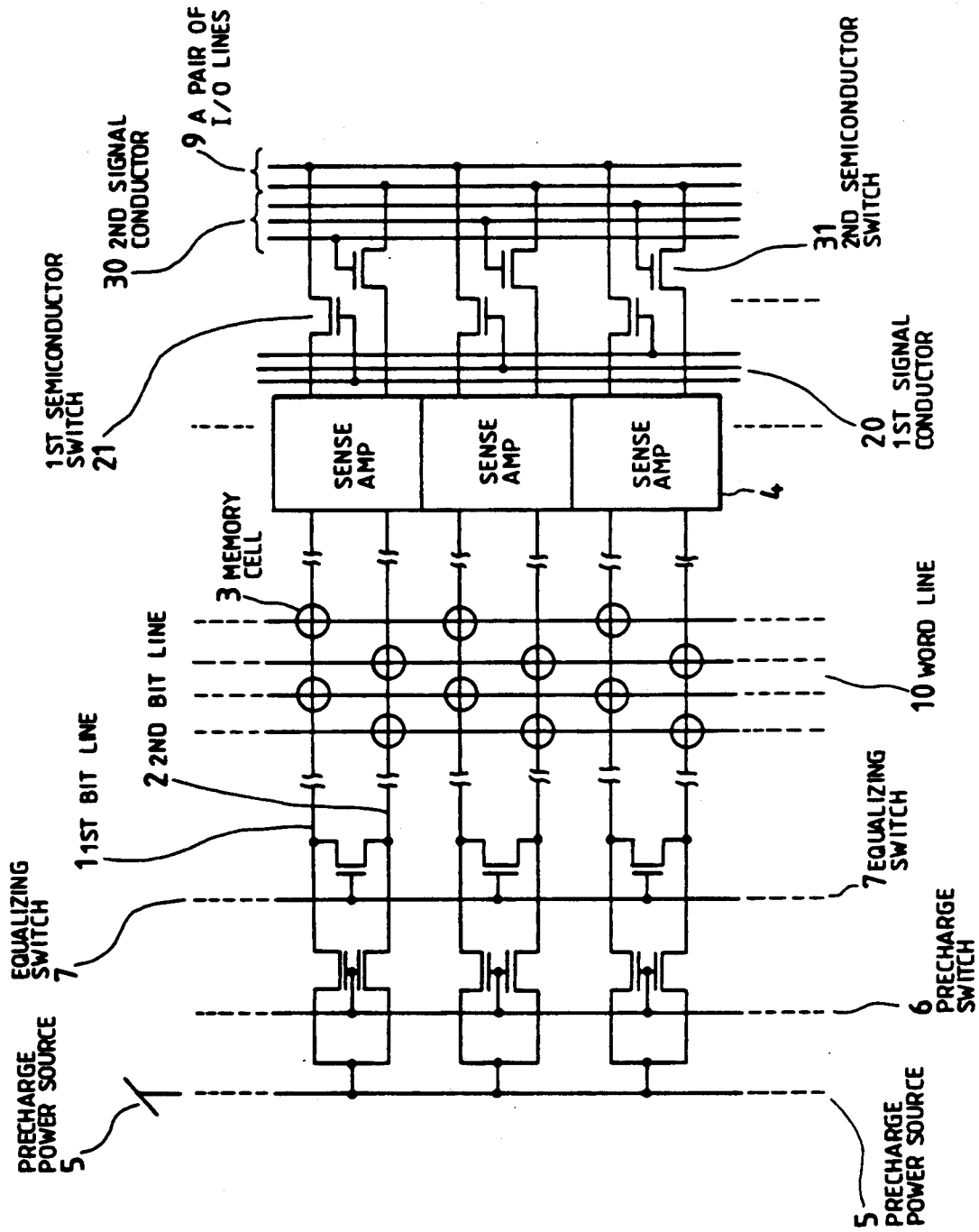
FIG. 9 is a circuit diagram for partly showing the construction of a third embodiment of the present invention.

Turning now to FIG. 9, there is shown a third embodiment of the present invention. The construction and operation of this sensing circuit for a DRAM will be described hereinbelow.

As is seen from in this figure, the construction of this sensing circuit is the same as that of the conventional sensing circuit except that signals sent through a first signal conductor 20 and a second signal conductor 30 respectively control a first semiconductor switch 21 and a second semiconductor switch 31, which are used to equalize the electric potentials of pairs of bit lines.

Figure 8:
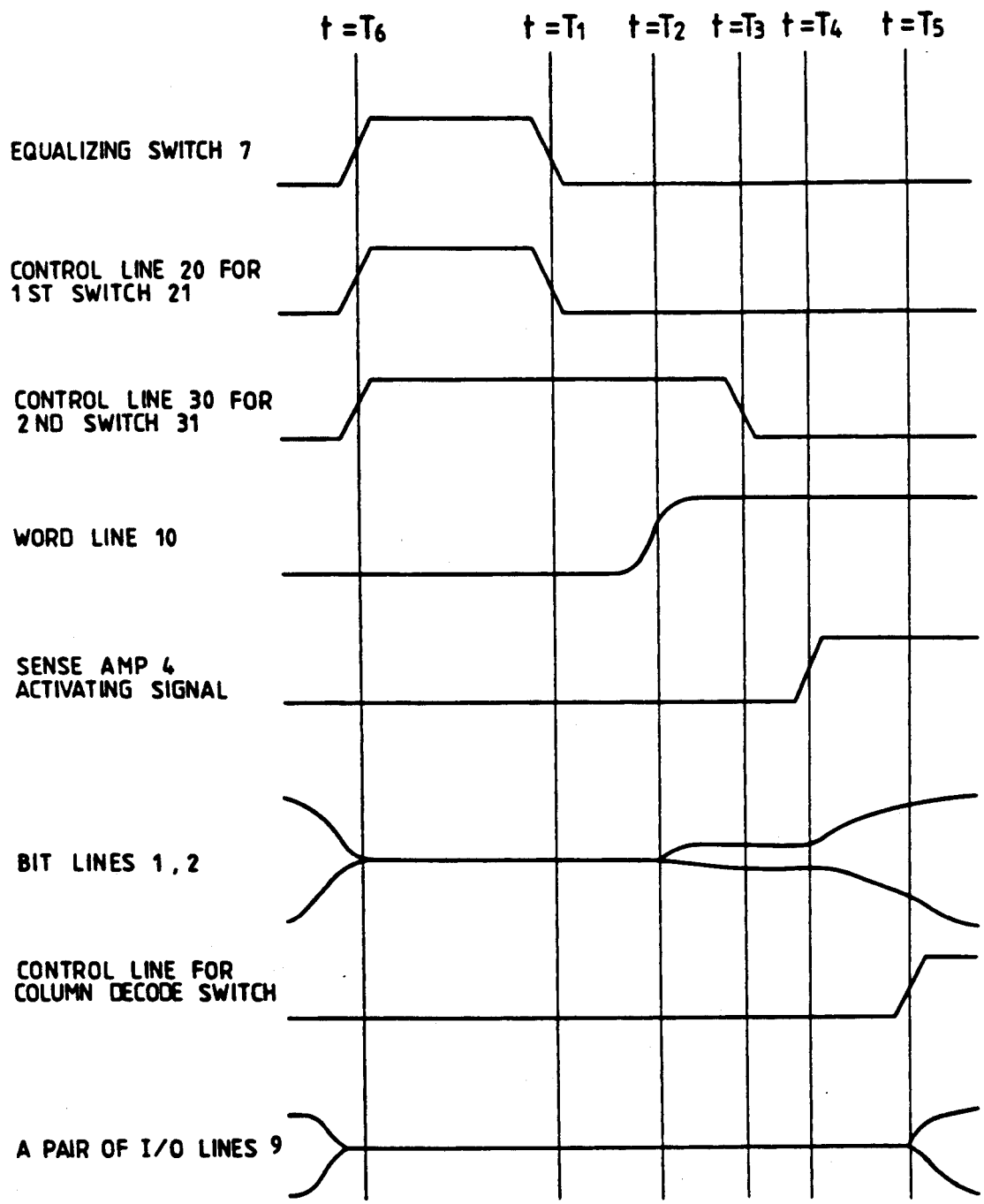
FIG. 8 is a timing chart for illustrating an operation of the second embodiment of the present invention.

Further, in case of this embodiment, a timing chart of various signals is essentially the same as FIG. 8. Thus, a reading process in case of this embodiment will be explained hereinbelow by referring to a timing chart of FIG. 8. Namely, the reading process of this sensing circuit comprises the following steps:

(1) First, at a time $T_0$, an equalizing switch 7, a precharge switch 6, and the first and second semiconductor switches 21 and 31 are turned on, and then each of the bit lines 1 and 2 is connected to the precharge power source 5.

(2) Further, at a time $T_1$, are turned off the equalizing switch 7, the precharge switch 6 and the semiconductor switch 21 connected to the bit line 1 which is connected to a memory cell 3 selected by a signal sent through a word line 10. Then, the bit line 1 is separated from the precharge power source 5.

(3) Moreover, at a time $T_2$, one of the word lines 10 is selected and thus the memory 3 and the bit line 1 are electrically connected to each other.

(4) Then, at a time $T_3$, the semiconductor switch 31, which is turned on in the step (2) and is being on, is also turned off and thus the bit line 2 is separated from a pair of I/O lines 9.

(5) Thereafter, at a time $T_4$, a sense amplifier 4 is activated and thereby the signal on the bit line 1 or 2 is amplified.

(6) Further, at a time $T_5$, the first and second semiconductor switches 21 and 31 are selected correspondingly to a column address, and furthermore data are outputted to the pair of I/O lines 9.

Further, all of the bit lines on the reference side are connected through the I/O lines 9 to each other. Therefore, the influence of the noise from the contiguous bit lines on each of the bit lines on the reference side is decreased for the same reason in case of the first embodiment. Furthermore, in case of this embodiment, the influence of the noise on each of the bit lines on the reference side is decreased by the distribution capacitance of the I/O lines 9.

Thus, can be prevented the occurrence of the phenomenon, which is the problem of the conventional sensing circuit as described above, that the electric potential of eachi bit line on the reference side varies with the voltage detected by the corresponding continuous bit line, and the difference in electric potential between each pair of the bit lines becomes small.

Figure 10:
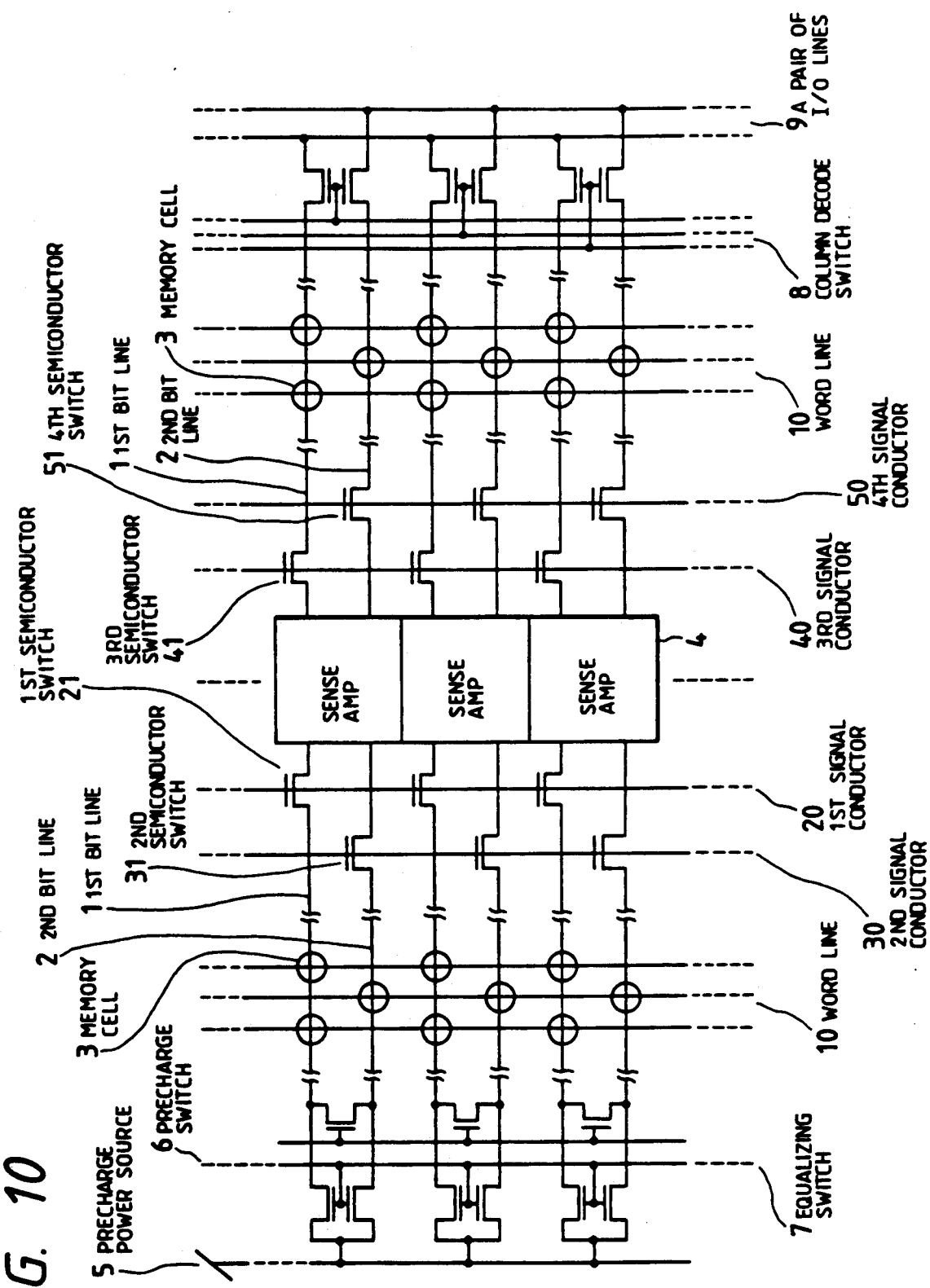
FIG. 10 is a circuit diagram for partly showing the construction of a fourth embodiment of the present invention

Referring next to FIG. 10, there is shown a third embodiment of the present invention. The construction and operation of this sensing circuit for a DRAM will be described hereinbelow.

Further, as is seen from in this figure, the construction of this sensing circuit is the same as that of the conventional sensing circuit except that signals sent through a first signal conductor 20 and a second signal conductor 30 respectively control a first semiconductor switch 21 and a second semiconductor switch 31, which are used to equalize the electric potentials of pairs of bit lines.

Next, in case of this embodiment, a timing chart of various signals is essentially the same as FIG. 8. Thus, a reading process in case of this embodiment will be explained hereinbelow by referring to a timing chart of FIG. 8. Namely, the reading process of this sensing circuit comprises the following steps:

(1) First, at a time $T_0$, an equalizing switch 7, a precharge switch 6, and the first and second semiconductor switches 21 and 31 are turned on, and then each of the bit lines 1 and 2 is connected to the precharge power source 5.

(2) Further, at a time $T_1$, are turned off the equalizing switch 7, the precharge switch 6 and the semiconductor switch 21 connected to the bit line 1 which is connected to a memory cell 3 selected by a signal sent through a word line 10. Then, the bit line 1 is separated from the precharge power source 5.

(3) Moreover, at a time $T_2$, one of the word lines 10 is selected and thus the memory 3 and the bit line 1 are electrically connected to each other.

(4) Then, at a time $T_3$, the semiconductor switch 31, which is turned on in the step (2) and is being on, is also turned off and thus the bit line 2 is separated from a pair of I/O lines 9.

(5) Thereafter, at a time $T_4$, a sense amplifier 4 is activated and thereby the signal on the bit line 1 or 2 is amplified.

(6) Further, at a time $T_5$, the first and second semiconductor switches 21 and 31 are selected correspondingly to a column address, and furthermore data are outputted to the pair of I/O lines 9.

Moreover, each of the bit lines on the reference side and the corresponding bit line at the opposite side are placed facing each other with the sense amplifier 4 therebetween and are connected to each other. This results in that the coupling capacitance of each bit line is becomes larger and thus change in electric potential of each bit line on the reference side the influence of the noise from the contiguous bit lines thereon is small. Further, in case of this embodiment, when the sense amplifier is activated, all of the bit lines can be separated from the sense amplifier 4 and thus the influence of the noise from the contiguous bit lines on each of the bit lines on the reference side is extermely small. Furthermore, considering that the rate of the coupling capacitance between each pair of the contiguous bit lines to the total capacitance of each bit line will increase due to rapid increase in memory density of a DRAM in the future and that the influence of the noises from the contiguous bit line will be further serious, the scheme employed in this embodiment is considered as one of the best methods for resolving such a serious problem.

Thus, becomes hard to occur the phenomenon, which is the problem of the conventional sensing circuit as described above, that the electric potential of each bit line on the reference side varies with the voltage detected by the corresponding contiguous bit line, and the difference in electric potential between each pair of the bit lines becomes small.

While preferred embodiments of the present invention have been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A sensing circuit for a dynamic random access memory, comprising:
   a plurality of pairs of first bit lines capable of being connected to a memory cell and second bit lines complemented with respect to the first bit lines;
   a first signal conductor for sending a first control signal;
   a second signal conductor for sending a second control signal;
   a first semiconductor switch controlled by the first control signal from said first signal conductor and connected to a point between the first bit lines of said pairs of first and second bit lines for connecting the first bit lines to the memory cell in response to the first control signal sent through said first signal conductor;
   a second semiconductor switch controlled by the second control signal from said second signal conductor and connected to a point between the second bit lines of the said pairs of bit lines; and
   suppression means connected to said first and second semiconductor switches and to which the second bit lines are connected by turning said second semiconductor switch on when a read signal is outputted to the first bit lines from the memory cell.

2. A sensing circuit for a dynamic random access memory as set forth in claim 1, wherein said suppression means comprises a load capacitance having capacitance sufficiently larger than the capacitance of said first and second bit lines.

3. A sensing circuit for a dynamic random access memory as set forth in claim 1, wherein said suppression means comprises a power source line for connecting said first and second semiconductor switches to a power source.

4. A sensing circuit for a dynamic random access memory, comprising:
   a plurality of pairs of first bit lines capable of being connected to a memory cell and second bit lines complemented with respect to the first bit lines;
   a power source line connected to a power source;
   a first signal conductor for sending a first control signal;
   a second signal conductor for sending a second control signal;
   a first semiconductor switch controlled by the first control signal from said first signal conductor and connected to a point between the first bit lines of said pairs and said power source line; and
   a second semiconductor switch controlled by the second control signal from said second signal conductor and connected to a point between the second bit lines of said pairs and said power source line.

5. A sensing circuit for a dynamic random access memory, comprising:
- a plurality of pairs of first bit lines capable of being connected to a memory cell and second bit lines complemented with respect to the first bit lines;
- an input/output data line for inputting/outputting data;
- a first signal conductor for sending a first control signal;
- a second signal conductor for sending a second control signal;
- a first semiconductor switch controlled by the first control signal from said first signal conductor and connected to a point between the first bit lines of said pairs and said input/output data line; and
- a second semiconductor switch controlled by the second control signal from said second signal conductor and connected to a point between the second bit lines of said pairs and said input/output data line.

6. A sensing circuit for a dynamic random access memory, comprising:
- a plurality of pairs of first bit lines capable of being connected to a memory cell and second bit lines complemented with respect to the first bit lines;
- a sense amplifying means for receiving and amplifying a signal;
- a first signal conductor for sending a first control signal;
- a second signal conductor for sending a second control signal;
- a first semiconductor switch controlled by the first control signal from said first signal conductor and connected to a point between the first bit lines of said pairs and said sense amplifying means;
- a second semiconductor switch controlled by the second control signal from said second signal conductor and connected to a point between the second bit lines of said pairs and said sense amplifying means;
- a plurality of pair of third bit lines capable of being connected to a memory cell and fourth bit lines complemented with respect to the third bit lines, and pairs of the third and fourth bit lines being provided across said sense amplifying means from corresponding pairs of the first and second bit lines;
- a third signal conductor for sending a third control signal;
- a fourth signal conductor for sending a fourth control signal;
- a third semiconductor switch controlled by the third control signal from said third signal conductor and connected to a point between the third bit lines of said pairs and said sense amplifying means; and
- a fourth semiconductor switch controlled by the fourth control signal from said fourth signal conductor and connected to a point between the fourth bit lines of said pairs and said sense amplifying means.

7. A sensing circuit for a dynamic random access memory as set forth in claim 1, further comprising a sense amplifying means connected to both the first and second bit lines for receiving signals from the first and second bit lines and amplifying the received signal, wherein said first and second semiconductor switches are turned on respectively in response to the first control signal sent through said first signal conductor and the second control signal sent through said second signal conductor at the time of equalization of the bit lines, wherein at the time of selecting a word line and reading data signal from said memory cell corresponding to said selected word line, only the semiconductor switch connected to the bit line, which is further connected to said memory cell corresponding to said selected word line, is turned off by the first or second control signal sent through said first or second signal conductor, and wherein at the time of activation of said sense amplifying means, both of said first and second semiconductor switches are turned off.

8. A sensing circuit for a dynamic random access memory as set forth in claim 6, wherein said first, second, third and fourth semiconductor switches are turned on respectively in response to the first control signal sent through said first signal conductor, the second control signal sent through said second signal conductor, the third control signal sent through said third signal conductor, the fourth control signal sent through said fourth signal conductor at the time of equalization of the bit lines, wherein at the time of selecting a word line and reading data signal from said memory cell corresponding to said selected word line, only the semiconductor switches connected to the bit lines, which are further connected to said memory cell corresponding to said selected word line, are turned off by the first, second, third or fourth control signal, and wherein at the time of activation of said sense amplifying means, all of said first, second, third and fourth semiconductor switches are turned off.

9. A sensing circuit for a dynamic random access memory as set forth in claim 4, further comprising a sense amplifying means connected to both the first and second bit lines for receiving signals from the first and second bit lines and amplifying the received signal, wherein said first and second semiconductor switches are turned on respectively in response to the first control signal sent through said first signal conductor and the second control signal sent through said second signal conductor at the time of equalization of the bit lines, wherein at the time of selecting a word line and reading data signal from said memory cell corresponding to said selected word line, only the semiconductor switch connected to the bit line, which is further connected to said memory cell corresponding to said selected word line, is turned off by the first or second control signal sent through said first or second signal conductor, and wherein at the time of activation of said sense amplifying means, both of said first and second semiconductor switches are turned off.

10. A sensing circuit for a dynamic random access memory as set forth in claim 5, further comprising a sense amplifying means connected to both the first and second bit lines for receiving signals from the first and second bit lines and amplifying the received signal, wherein said first and second semiconductor switches are turned on respectively in response to the first control signal sent through said first signal conductor and the second control signal sent through said second signal conductor at the time of equalization of the bit lines, wherein at the time of selecting a word line and reading data signal from said memory cell corresponding to said selected word line, only the semiconductor switch connected to the bit line, which is further connected to said memory cell corresponding to said selected word line, is turned off by the first or second control signal sent through said first or second signal conductor, and wherein at the time of activation of said sense amplifying means, both of said first and second semiconductor switches are turned off

* * * * *